United States Patent [19]

Monnig et al.

[11] Patent Number: 4,696,833

[45] Date of Patent: Sep. 29, 1987

[54] METHOD FOR APPLYING A UNIFORM COATING TO INTEGRATED CIRCUIT WAFERS BY MEANS OF CHEMICAL DEPOSITION

[75] Inventors: Kenneth A. Monnig, Palo Alto, Calif.; David W. Quint, Ft. Collins, Colo.

[73] Assignee: Hewlett-Packard Company, Palo Alto, Calif.

[21] Appl. No.: 794,311

[22] Filed: Oct. 30, 1985

Related U.S. Application Data

[63] Continuation of Ser. No. 412,327, Aug. 27, 1982, abandoned.

[51] Int. Cl.[4] ............................................. H01L 21/88
[52] U.S. Cl. ........................................ 437/225; 427/99; 427/124; 427/255.1; 427/255.2; 427/253; 118/728
[58] Field of Search .............. 427/99, 253, 91, 255.1, 427/124, 255.2, 9; 118/728, 500

[56] References Cited

U.S. PATENT DOCUMENTS

| | | | |
|---|---|---|---|
| 3,594,227 | 7/1971 | Oswald | 118/730 X |
| 3,697,343 | 10/1972 | Cuomo et al. | 427/253 |
| 3,704,987 | 12/1972 | Arndt et al. | 118/725 X |
| 3,717,439 | 2/1973 | Sakai | 118/724 |
| 4,096,822 | 6/1978 | Yamowaki et al. | 118/729 |
| 4,098,923 | 7/1978 | Alberti et al. | 427/93 X |
| 4,108,106 | 8/1978 | Dozier | 427/82 X |
| 4,220,116 | 9/1980 | Hochberg | 118/728 X |
| 4,309,240 | 1/1982 | Zaferes | 156/611 |
| 4,419,332 | 12/1983 | von der Ropp | 118/725 X |
| 4,466,381 | 8/1984 | Jenkins | 118/728 |

Primary Examiner—John D. Smith
Attorney, Agent, or Firm—Edward Y. Wong; John A. Frazzini

[57] ABSTRACT

A method and an apparatus are disclosed which are suitable for applying uniform coatings to integrated circuit (IC) wafers by means of chemical vapor deposition in a process suitable for use in mass production of IC wafers. The process introduces a first group of reactant gases into the vicinity of the wafers through at least one inlet. The number of inlets and the positions of inlets are selected to reduce the total variation in thickness produced on a batch of wafers to within preselected values of variations. The choices of pressure and temperature as well as the choice of gases in the first group are selected to optimize uniformity.

3 Claims, 9 Drawing Figures

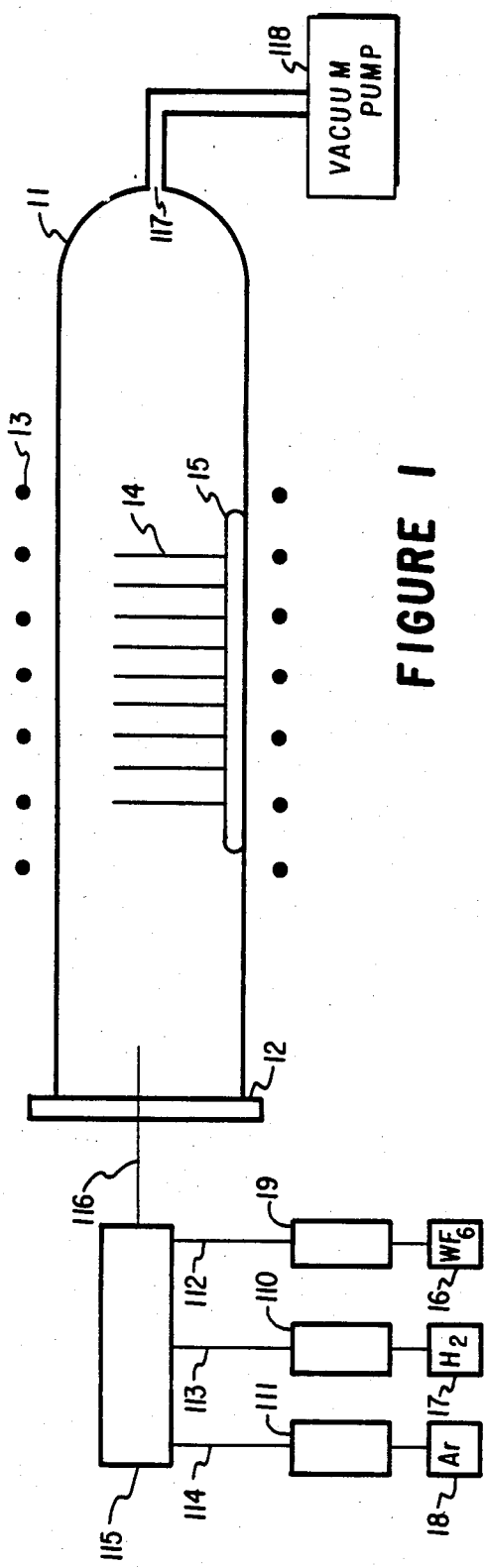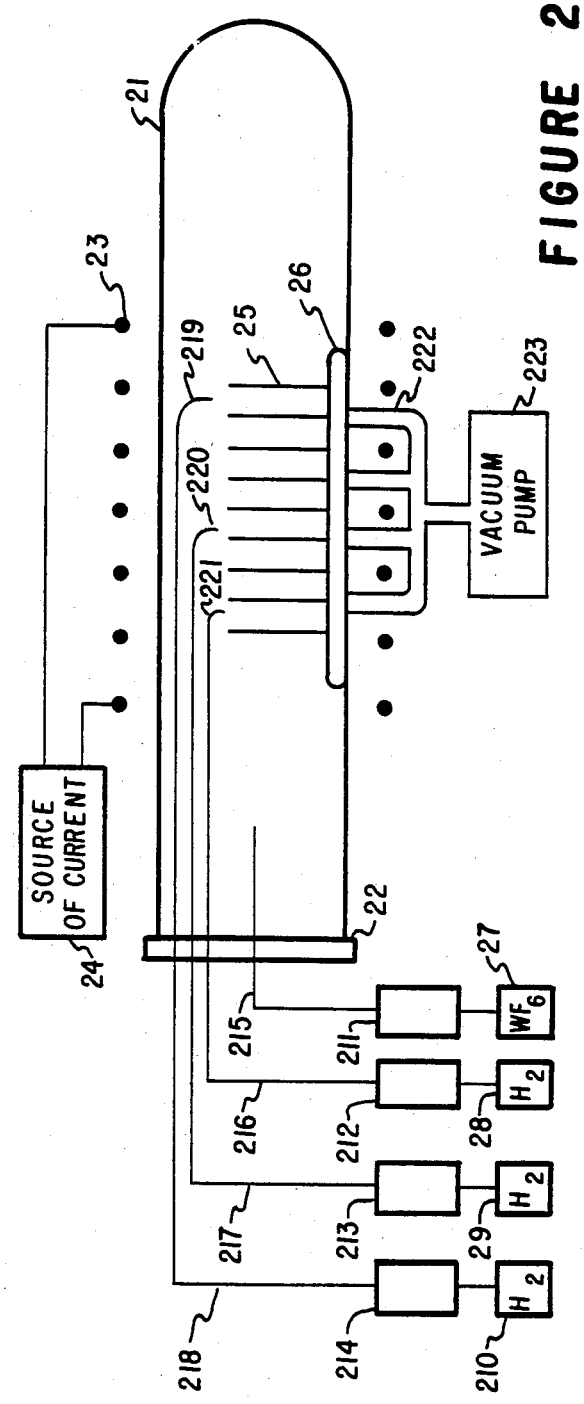

METHOD FOR APPLYING A UNIFORM COATING TO INTEGRATED CIRCUIT WAFERS BY MEANS OF CHEMICAL DEPOSITION

CROSS REFERENCE TO RELATED APPLICATION

This application is a continuation of application Ser. No. 412,327 filed Aug. 27, 1982, now abandoned.

BACKGROUND OF THE INVENTION

A significant trend in integrated circuit technology is the ability to manufacture increasingly smaller circuits. Such reduction of the size of circuits has the obvious advantage of increasing the number of circuits per unit area thereby enabling the production of more complex circuits on a single integrated circuit (IC) wafer. This reduction in size also enables the production of faster circuits requiring less power per circuit.

Unfortunately, the reduction in size creates a number of processing problems which can differ qualitatively as well as quantitatively from processes suitable for larger circuit geometries. Under common design rules, if the length and width of a circuit is scaled by a factor L, then the thickness of interconnect lines scales as the square root of L. Under such scaling rules the cross sectional area of interconnect lines requirements of IC wafers incorporating circuits with reduced geometry thereby also increasing the heat dissipation requirements of such wafers. Increased resistance in interconnect lines also increases the risk of current spikes in such lines inadvertently turning on or off various transistors in these circuits because of the associated increase in the voltage drop caused by such spikes. It is therefore essential to utilize low resistivity material in interconnect lines to minimize the problems resulting from these and similar problems. The low resistivity of aluminum is one of the major reasons that it has been used so extensively in the past in interconnect lines.

The current requirements of smaller circuits typically decrease more slowly with size than the cross sectional area of interconnect lines so that the current density in these lines also tends to increase with decrease in size. In present state of the art devices having line widths on the order of 1 micron, the resulting current densities produce electromigration in aluminum interconnect lines resulting in voids and breaks in such lines. These problems have spurred interest in using refractory metals such as tungsten, molybdenum, beryllium and tantalum in the interconnect lines because of their increased ability to carry large current densities without electromigration. Refractory metals are characterized as having significantly higher melting points than aluminum so that the use of refractory metals for interconnect lines has the additional advantage of allowing high temperature processing subsequent to the metallization steps.

Of the refractory metals, tungsten appears to be the most promising choice for use in interconnect lines (See J. M. Shaw and J. A. Amick, "Vapor-deposited tungsten as a metallization and interconnection material for silicon devices", *RCA Review*, June 1970). Tungsten has a fairly low value of resistivity (approximately 3 times the resistivity of aluminum), has relatively high eutectic and silicide formation temperatures and has a relatively high activation energy for self-diffusion. The high silicide formation temperature is important because silicide films frequently develop cracks due to the volume change associated with silicide formation. Tungsten also has a thermal coefficient of expansion fairly close to that of silicon so that deposited tungsten interconnect lines develop a relatively low amount of intrinsic stress as the IC wafer cools to room temperature after completion of the metallization steps. This is important because such intrinsic stress will tend to pull the deposited line away from the underlying substrate resulting in lessened adherence to the substrate. Tungsten is also fairly corrosion resistant so that subsequent processing steps in which the substrate is immersed in or washed by acids or deionized water will not significantly attack tungsten interconnect lines.

For the reasons indicated above, work was initiated in the late 1960's to develop methods for applying tungsten to IC wafers for interconnect lines. However, such work did not result in methods suitable for use in the manufacture of IC wafers probably because of the difficulty in applying tungsten in layers of uniform reproducible thickness. Uniformity in thickness is important in producing interconnect lines of uniform width. Typically, during the etching step in which the interconnect lines are defined, the portions of the tungsten layer which are not to be removed are shielded from the etchant by an overlying mask. Even in a plasma etching process there is some etching of the tungsten under the mask so that the resulting interconnect lines are narrowed and undercut in those regions where the etching process is continued past the time at which the removal of all of the tungsten that is to be removed has been completed. If the deposited tungsten does not have uniform thickness then pronounced narrowing and undercutting of interconnect lines can occur in the regions where the tungsten layer is thinner than average. For 1 micron line widths, such narrowing and undercutting can amount to a significant fraction of the width of the interconnect lines resulting in line segments having increased resistance per unit length and reduced adhesion to the underlying substrate.

In the past, metallization was most commonly applied by sputtering or evaporation. Because of the high melting point of refractory metals, deposition by means of an evaporation process requires a temperature which is too high to be compatible with the other steps in the IC fabrication process. Deposition by means of sputtering is inherently a low speed process and therefore is not attractive for a production process. In addition, the step coverage, intrinsic stress and resistivity of the resulting interconnect lines are generally not satisfactory. Therefore the most attactive process for depositing refractory metals is chemical vapor deposition (CVD).

Most prior chemical vapor deposition processes utilized cold wall systems in which the IC wafers are laid flat on a susceptor which was heated to the desired reaction temperature by rf heating. A typical prior art reaction chamber utilizing such a system is shown in FIG. 1 in the reference by J. M. Shaw and J. A. Amick entitled "Vapor-Deposited Tungsten as a Metallization and Interconnection Material for Silicon Devices" published in the *RCA Review* in June 1970. The susceptor only has room for a few IC wafers so that the number of wafers that can be manufactured per hour is lower than desired for a production process. Production processes therefore typically require the utilization of a boat in which many IC wafers are supported on edge in a linear array of parallel wafers. Because of the reduction in contact area between the wafers and the boat as compared to that between the wafers and a susceptor on which the wafers are laid flat, the processes utilizing a boat cannot adequately heat the wafers by heating the boat with rf heating. Processes utilizing a boat therefore typically are hot wall processes.

In FIG. 1 is a typical prior art hot walled CVD system suitable for depositing tungsten on integrated circuit wafers by means of the reaction in which tungsten hexafluoride is reduced by hydrogen. The reaction chamber in which the CVD reaction occurs is enclosed by a cylindrical wall 11 which is closed at one end by a door 12 which can be opened to enable IC wafers to be inserted or removed from the reaction chamber or can be closed to seal in the reactant gases. A set of heating coils 13 draw current from a voltage source to provide heat to the reaction chamber. The amount of current through the heating coils is regulated to control the temperature at which the CVD reaction occurs. The IC wafers 14 are supported on edge in a boat 15 to form a linear array of parallel wafers.

The reactant gases tungsten and hydrogen and a carrier gas argon are supplied from source bottles 16, 17, and 18 respectively. These gases are supplied through gas flow regulators 19, 110 and 111 to control the relative rate at which these gases are supplied to the reaction chamber. These gas flow regulators are connected through tubing 112, 113 and 114 to an external mixing chamber 115 in which the reactant gases are mixed before being supplied to the reaction chamber through a tube 116 which enters the reaction chamber near door 12. The unreacted reactants and the reaction products which have not deposited on the wafers or on the chamber walls are withdrawn from the reaction chamber through an exhaust port 117. A vacuum pump 118 is coupled to the exhaust port to draw off these reaction products and unreacted reactants. The vacuum pump and the gas flow regulators cooperate to determine the partial pressures of the reactant gases and of the carrier gas.

To increase the number of wafers within the chamber during the CVD process, the wafers are typically closely spaced in the boat so that between adjacent wafers there are only narrow gaps into which the reactant gases must enter. As illustrated in the reference by Shaw and Amick, both cold wall processes and hot wall processes typically mix the reactant gases externally to the reaction chamber and then supply the reactant gases at one end of the chamber while withdrawing reactant products and unreacted reactant gases at the other end of the chamber. As a result of this configuration, the concentration of reactant gases in the vicinity of wafers near the end at which reactant gases are supplied is higher than that in the vicinity of wafers nearer to the end at which gases are withdrawn from the chamber because reactant concentrations decrease as a result of the reaction which occurs as the reactants flow down the chamber. This non-uniformity in concentration results in inter-wafer variations in thickness in the resulting wafer coatings. Also the flow of gases is typically along the chamber in a direction perpendicular to the wafers so that the entrance of reactant gases into the gaps between adjacent wafers in a boat is primarily by diffusion. As a result of this the concentration of reactant gases will be higher near the edges of the wafers thereby producing intra-wafer variations in thickness of the resulting coatings. Both of these variations will produce variations in line widths and will also produce increased undercutting of lines in localized segments where the coating is thinner than average.

The amount of inter- and intra-wafer variation is particularly acute for CVD processes utilizing a reaction having a relatively high rate of reaction because in such processes an increased fraction of the CVD reaction will occur in the vicinity of where the reactants enter the chamber thereby increasing the inter-wafer variation. This increased rate will also increase the fraction of the CVD reaction occuring at the edges of the wafers before the reactants have time to diffuse into the gap between adjacent wafers in the boat. In one existing process (See Nicholas E. Miller and Israel Beinglass, "Hot-Wall CVD Tungsten for VLSI, *Solid State Technology*, Dec. 1980, Vol. 23, No. 12) the reaction rate of a reaction is reduced by reducing the pressure and temperature of the CVD process and by using an inhibitor. However, that process not only sacrifices processing speed, it also still displays a 10% inter-wafer variation and a 8% intra-wafer variation in coating thickness. A process is therefore required which retains the high throughput associated with processes utilizing a boat while also producing a uniform coating both across a given individual wafer and from wafer to wafer.

SUMMARY OF THE INVENTION

In accordance with the illustrated preferred embodiment, a method and apparatus are presented for applying uniform coatings to integrated circuit wafers by means of chemical vapor deposition. The invention provides a process having adequate throughput to be useful for mass production of integrated circuits. The process also applies highly uniform coatings suitable for use in producing integrated circuits having interconnect lines on the order of 1 micron in width.

In order to obtain a high level of throughput, the preferred embodiment utilizes a hot wall chemical vapor deposition process in which the integrated circuit wafers to be coated are supported on edge in a boat to form a linear array of parallel wafers. The wafers are therefore contained in a cylindrical region having a cross-section matching the lateral cross-section of the wafers to be coated.

To improve the uniformity of coating thickness in the case of a single reactant which decomposes in the chamber to deposit one of the decomposition products, this reactant is introduced in the vicinity of the wafers. To improve the uniformity of coating thickness produced by a reaction between a plurality of reactant gases, the reactant gases are introduced into the reaction chamber in at least two separate groups so that the CVD reaction begins only after the reactant gases are allowed to mix in the reaction chamber. A first group of reactants is introduced into the reaction chamber in the vicinity of the wafers so that the CVD reaction occurs primarily in the vicinity of the wafers. The reactants in this group are preferrably supplied into the reaction chamber through several inlets positioned to disperse the reactant gases in this group uniformly in the vicinity of the wafers. The region containing the wafers is encircled by a cylindrical liner and the inlets are oriented to direct the reactant gases against the liner to produce a turbulent mixing of these gases and to heat the gases. To improve such heating of the gases, the liner should be formed of a material which is thermally conductive and opaque to infrared light. In one preferred embodiment, the reaction products and unreacted reactant gases are withdrawn from the reaction chamber through an exhaust port that is located at a point so that the wafers are situated in a region between the exhaust port and the inlets for the first group of reactant gases.

The first group of reactant gases is selected to include a first reactant gas which takes part in a step in the CVD reaction which has a significant effect on the rate of the CVD reaction (ie. a rate limiting step). The first reactant gas is supplied in less than its stoichiometric ratio relative to the other reactant gases participating in that rate limiting step so that the uniformity of the resulting coating thickness is strongly dependent on or, preferably, essentially dependent only on the uniformity of the concentration of the first reactant gas in the vicinity of the wafers. The first reactant gas is also selected to have the lowest molecular weight of any of the reactant gases participating in that rate limiting step so that the diffusion rate of the first reactant gas will be at least as high as any of the other reactant gases participating in that rate limiting step, thereby enhancing the uniformity of the concentration of this rate controlling reactant in the vicinity of the wafers.

The inlets are disposed near the edges of the cylindrical region containing the wafers in a pattern which minimizes the variation in the concentration of those reactant gases in the first group of reactant gases which have a significant effect on the rate of deposition of CVD products on the surfaces of the wafers. The sizes of the inlets and the flow rates through the inlets are also selected to minimize the variation in the concentration of these gases.

DESCRIPTION OF THE FIGURES

FIG. 1 shows a typical prior art device suitable for applying tungsten to IC wafers by means of the chemical vapor deposition process in which tungsten hexafluoride is reduced by hydrogen.

FIG. 2 shows an embodiment of the present invention for the case of tungsten deposition to IC wafers by means of the chemical vapor deposition process in which tungsten hexafluoride is reduced by hydrogen.

DESCRIPTION OF THE PREFERRED EMBODIMENT

Figure 3:
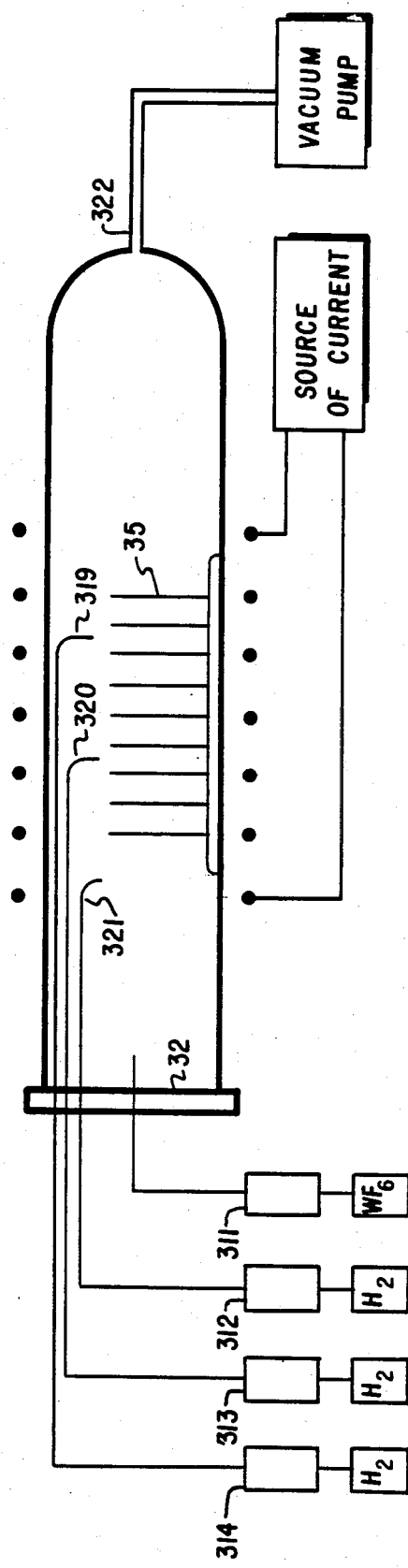
FIG. 3 shows an alternate embodiment of the present invention for the case of tungsten deposition to IC wafers by means of the chemical vapor deposition process in which tungsten hexafluoride is reduced by hydrogen.

In FIG. 2 is shown an embodiment of the CVD system suitable for practicing the invention. As in the prior art device presented in FIG. 1 and discussed in the background, the reaction chamber is enclosed by a wall 21 and a door 22. A set of heater coils 23 are provided adjacent to the wall 21 to provide heat to the reaction chamber. Current is supplied to the coils from a source of current 24 which is regulated to control the temperature of the reactant gases in the reaction chamber. The IC wafers 25 are supported on edge in a boat 26 to form a linear array of parallel IC wafers. The system shown in FIG. 2 is suitable for supplying the reactant gases tungsten hexafluoride and hydrogen to the reaction chamber but the system can clearly be altered to supply other gases to the reaction chamber to implement other reactions such as reduction reactions of other compounds containing any of the refractory metals including tungsten, beryllium, molybdenum and tantalum. In the example shown in FIG. 2, the reactant gases are supplied by sources of gas 27, 28, 29 and 210. The relative flow rates of the gases is controlled by gas flow controllers 211, 212, 213 and 214. These controllers are preferrably mass flow controllers such as Tylan mass flow controllers but they could also be other types such as needle valves.

In the case of decomposition CVD reactions, the reactant to be decomposed is injected into the reaction chamber in the vicinity of the wafer. In the case of a reaction between several reactants, the reactant gases are supplied to the reaction chamber in at least two groups which are allowed to mix only in the vicinity of the wafers so that the uniformity of the thickness of the resulting coating which deposit on the IC wafers is improved. In the example in FIG. 2, hydrogen is supplied in a first group of gases and the tungsten hexafluoride is supplied in a second group of gases. In this embodiment, the tungsten hexafluoride is supplied through a tube 215 which supplies the tungsten hexafluoride to the reaction chamber in the vicinity of the door (ie. nearer to the door than to the IC wafers—typically within a few cm of the door). In contrast, the gases in the first group of reactant gases are supplied through tubes 216-218 to a set of inlets 219-221 positioned in the vicinity of the IC wafers (ie. much nearer to the IC wafers than to the door and typically within a few cm of the edges of the wafers). Carrier gases such as argon can be supplied along with each of the reactants as shown in FIG. 1 and an external mixing chamber can be included to improve the homogeneity of mixtures of gases. However, for fixed sizes of inlets and flow rates of reactants, the primary affect of the carrier gas is to increase the velocity at which gases exit the inlets. Such increased flow can be beneficial in some cases because it distributes the reactant gases throughout the region containing the wafers before reaction between reactants can produce a notable concentration gradient. However, in the case shown in FIG. 2, adequate coating uniformity was achieved without introducing carrier gases. Because separate tubes 216-218 connect inlets 219-221 to flow controllers 212-214, these controllers can individually vary the flow rates through each inlet. Such individual control enables flow rates to be varied as conditions change in order to maintain optimum uniformity. The diameter of each inlet for a given flow rate will determine the velocity of the entering gases.

The unreacted reactants, any carrier gases and the undeposited reaction products are removed from the reaction chamber through at least one exhaust port 222. The exhaust port is connected to a vacuum pump 223 which cooperates with the gas flow controllers 211-214 to control the partial pressures of the gases. In particular, the vacuum pump enables the CVD reaction to occur at below atmospheric pressures if such is desired for a given reaction. In this embodiment, the exhaust port is located so that the IC wafers are situated between the inlets 219-221 and the exhaust port 222. In an alternative embodiment shown in FIG. 3, the exhaust port 322 is located at the end of the chamber opposite to the door 32. The embodiment shown in FIG. 2 has the advantage of producing a convective flow of the first group of reactant gases parallel to the surfaces of the wafers thereby increasing the uniformity of the concentration of these gases in the narrow spaces between adjacent wafers. In this embodiment, in order to provide access of the gases in the reaction chamber to the exhaust port, either the boat 26 must be permeable to gas flow or the boat must be supported away from the exhaust port to provide an unobstructed path for these gases to flow to the exhaust port. The embodiment shown in FIG. 3 has the advantage of having the shape of reaction chambers and furnace systems now available so that the cost of such a system is reduced from that shown in FIG. 2. The embodiment in FIG. 3 also avoids the need to introduce the exhaust ports 222 through the hot zone created by heating coils 23. In spite of the disadvantage of producing a convective flow generally perpendicular the the wafers, a system such as that presented in FIG. 3 has successfully produced tungsten coatings on a batch of 75 wafers having an intra-wafer variation in coating thickness of less than 10%. This apparatus therefore enables the coating of large batches with uniform coatings while retaining processing speed. The furnace in FIG. 3 is therefore the current preferred embodiment for the invention.

Figure 5:
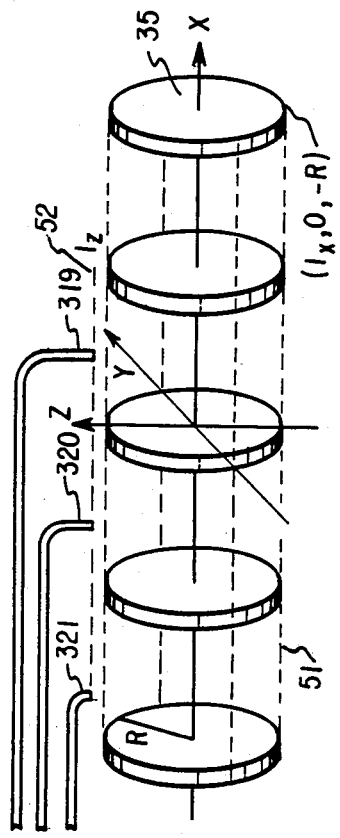
FIG. 5 shows an expanded view of the placement of inlets with respect to the IC wafers for the embodiment presented in FIG. 3.
Figure 4:
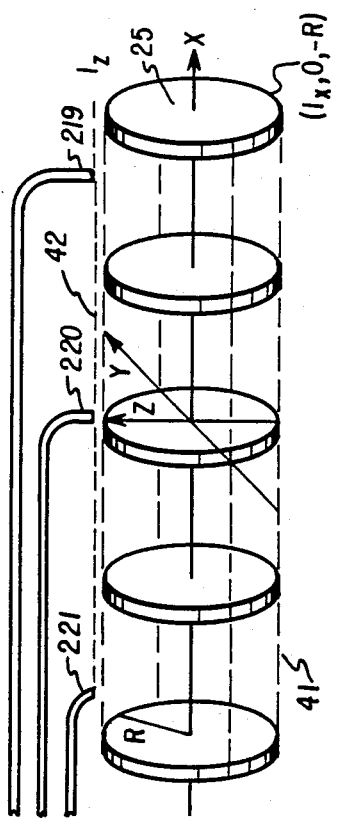
FIG. 4 shows an expanded view of the placement of inlets with respect to the IC wafers for the embodiment presented in FIG. 2.

Magnified figures showing the spatial relationship between the wafers and the inlets for the first group of reactant gases are presented in FIGS. 4 and 5 for the embodiments presented in FIGS. 2 and 3, respectively. Only 5 wafers are shown in these figures to aid the clarity of the illustration although typically many more wafers (on the order of 100 wafers) than this will be processed in one batch. In addition, the spacing has been accentuated to further assist visualization. The set of wafers 25 include two end wafers: a first wafer shown as the left-most wafer in FIG. 4 and a last wafer shown as the right-most wafer in FIG. 4. The wafers are contained in a circular right-cylinder 41 having side edges shown as the dashed lines and having end faces defined by the first and last wafers. A reference set of axes are presented in FIG. 4 and are oriented so that the x-axis is aligned along the direction of the array of wafers, the y-axis is aligned along the lateral wafer length directed horizontally and the z-axis is aligned along the lateral wafer length directed vertically. The origin of the axes is positioned in the center of this volume so that the volume extends from $x = -$ to $+1_x$ and from $Y^2 + Z^2 = 0$ to $Y^2 + Z^2 = R^2$ for some length $1_x$, and radius R (typically R is on the order of 50mm). In general the wafers will be contained in a cylindrical volume having a cross-section of the same shape and size as the lateral cross-section (i.e. the cross-section in the y-z plane) of the wafers.

In the embodiment shown in FIG. 4 the inlets 419-421 are positioned in a linear array along a line 42 located at $y=0$ and $z=1_z$ where $1_z$ is greater than R. The inlets are also spaced symmetrically about the point $x=0$, $y=0$ and $z=1_z$. The inlets are positioned a few centimeters above the wafers to enable the boat containing the wafers to be slid into or out of the reaction chamber without having to first temporarily move the inlets out of the way. This spacing also allows the reactant gases supplied through each of the inlets to diffuse laterally in an approximately Gaussian distribution centered on the inlet from which those gases are supplied before those gases are drawn into the spaces between adjacent wafers.

Figure 6:
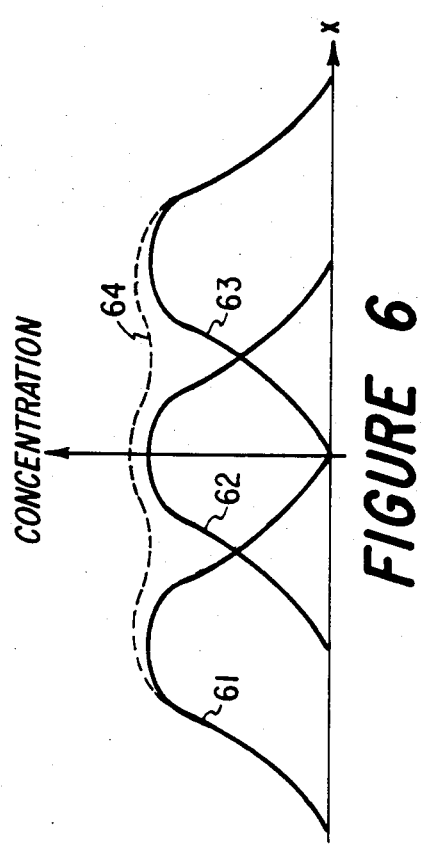
FIG. 6 shows the concentration distribution of a typical reactant gas in the first group of reactant gases resulting from the embodiment presented in FIG. 2.

For a selected one of the reactant gases in the first group of reactants, the resulting concentration as a function of x along any line having constant y and z coordinates within the volume containing the wafers is shown in FIG. 6. The concentration distributions from inlets 221, 220 and 219 are shown respectively as solid curves 61, 62 and 63. The total concentration distribution is shown a dashed curve 64. A similar pattern results for each line of constant y and z within the volume containing the wafers. For the linear array of inlets shown in FIG. 4, the maximum concentration in the volume containing the wafers will occur on the line $y=0$, $z=R$. Likewise the minimum concentration will occur on the line $Y=0$ $Z=-R$.

The difference between the maximum concentration and the minimum concentration within the volume containing the wafers is a function of the rate of gas flow through each of the inlets, the velocity of gas flow through each of the inlets and the x, y and z positions of each of the inlets. Note that the rates of gas flow can be regulated by the mass flow controllers such as controllers 211-214 in FIG. 2 or 311-314 in FIG. 3. For constant rates of flow, the velocities can be controlled by controlling the sizes of each of the inlets. Since the variation in line width and undercut is proportional to the variation in thickness of the coating, the choices of at least some of these parameters are typically selected to minimize the variation in coating thickness.

Because gases of different masses diffuse at different rates, the concentration distributions shown in FIG. 6 will be similar but not identical for each of the gases. The coating thickness variation (i.e., the difference in thickness between the maximum and minimum coating thickness) produced on a batch of wafers is generally a function of the concentration of more than one gas. A theoretical prediction of the optimum choice of parameters to minimize variation of coating thickness is most easily made if the rate of reaction is made to depend on the concentration of a single reactant. In such a case the variation in thickness is proportional to the variation within the volume containing the wafers of the concentration of this single reactant. Often the rate limiting step involves some chemicals which are products of previous steps in the CVD reaction so that the relevant concentrations can be a complicated function of the rate at which each reactant is supplied to the reaction chamber. In some processes, the rate limiting step includes at least one reactant gas so that the resulting thickness can be made a function of the concentration of a single reactant gas by making the rate of the rate limiting step depend essentially only on the concentration of that reactant gas.

In a reaction of the form $n1 A_1 + \ldots nk A_k$ react to form products (or intermediate products in a multistep reaction), the rate is generally proportional to $[A_1]n1 \ldots [A_k]nk$ where $[A_j]$ is the concentration of the A-th chemical and nj is the stoichiometric coefficient of Aj in the reaction. However, these gases having a significantly higher ratio of concentration to the concentration of any of the other gases reacting in the rate limiting step than the ratio of their associated stoichiometric coefficients will be saturated so that the reaction rate is essentially independent of their concentrations. In a reaction involving a reactant in the rate limiting step, the overall rate of reaction can be made to depend essentially only on the concentration of that single reactant by selecting gas flow rates which makes the ratio of its concentration to the concentration of the other chemicals in the rate limiting step much less than the ratios of their associated stoichiometric coefficients. Since the degree to which the reaction rate is made essentially independent of the concentrations of the other reactants is an increasing function of the ratios between the concentrations of those other reactants to the concentration of the reactant on which the rate is to vary, the concentration of this latter reactant can be made small enough compared to the others so that the reaction is saturated to any degree desired. The degree to which the reaction is not saturated in the other reactants will show up as that part of the rate that does not vary linearly with the concentration of this reactant gas.

Even in this case of the rate depending on the concentration of a single reactant, although a prediction can be made by well known calculations of diffusive and convective gas flow, the calculations are rather complicated so that in general the optimization will be made empirically. The empirical work can be simplified somewhat by optimizing with respect to only a subset of the parameters. For example in FIG. 3 the linear array requires the z component of position of each of the inlets be equal to a common value $1_z$ and that $y=0$ so that the optimization is made only with respect to the x position of each inlet. The minimization of the variation in coating thickness with respect to x, y and z for each inlet (or some subset of these parameters as in the case of a linear array of inlets) therefore defines the choice of inlet positions to inject the first group of reactants into the vicinity of the IC wafers. The inlet or inlets for the reactant and carrier gases not in the first group of reactants can similarly be separately supplied into the vicinity of the wafers but such a duplication of inlets is not required. If the inlet carrying these other gases introduces these gases into the reaction chamber away from the vicinity of the wafers but not in the region between the exhaust port and the wafers (in which case a large fraction of such gases would be swept from the chamber before entering the volume containing the wafers) then these gases will be enabled to move by convection and diffusion to produce a fairly uniform distribution at the edges of the volume containing the wafers so that a uniform concentration of these gases results in that volume. Because these gases are supplied separately from the first group of gases, they do not begin to react with the first group of reactants until arriving near the volume containing the wafers and therefore the gradient in concentration due to such reaction away from the wafers produced in the prior art embodiment shown in FIG. 1 is avoided.

Figure 7:
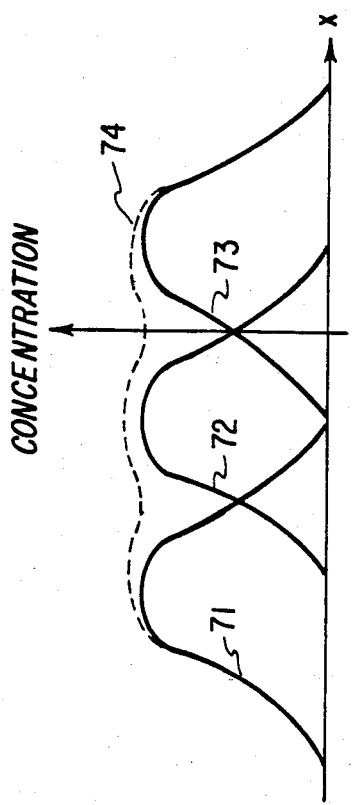
FIG. 7 shows the concentration distribution of a typical reactant gas in the first group of reactant gases resulting from the embodiment presented in FIG. 3.

In FIG. 7 are shown along lines of constant y and z the concentration distributions 71–73 produced by gases from inlets 21, 320 and 319 respectively and the total concentration distribution 74. Because the exhaust port produces a pressure gradient flow, the x-positions of the inlets 319–321 in FIG. 5 are shifted in the −x direction compared to the positions in FIG. 6 where the inlets are positioned symmetrically about the plane $x=0$. Similarly the concentration curves 71–73 are not symmetric in the x direction. However, the difference between the maximum and minimum coating thicknesses is still a function of the x-position of and the gas flow rate through each of the inlets so that these parameters can be chosen to minimize this difference. Typically, the optimum choice will be made empirically. However, if desired, the optimum values of the parameters can still be determined by straight forward but complicated calculations using models of convective and diffusive gas flow from a set of inlets through an array of parallel plates.

By means of well known empirical techniques, the resulting variation in coating thickness can be determined for each wafer. If the variation in coating thickness for a batch of wafers is larger than desired, then extra inlets can be added. For example, more than 3 inlets can be included in a linear array above the wafers or extra inlets can be included above the wafers to form a two dimensional array. Likewise, inlets on the sides (i.e., in the planes $y=R'$ and $y=-R'0$ where $R'$ is greater than R) can be included. In the embodiment shown in FIG. 3, extra inlets can be included below the wafers (i.e., in a plane $z=1_z''$ where $1_z''$ is greater than R), but extra wafers in the plane $z=-1_z''$ for the embodiment in FIG. 2 would have little effect on the coating thickness because of the convective flow toward the exhaust port. In all of these cases, in order to simplify insertion of the wafers into the reaction chamber the inlets should be arranged to allow the wafers to be inserted into the reaction chamber without having to move the inlets.

Figure 8:
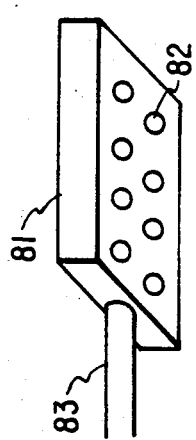
FIG. 8 shows a nozzle suitable for dispersing the first group of reactant gases into the vicinity of the integrated circuit wafers.

If a large number of inlets is required, then instead of supplying the gases through distinct inlets as in FIGS. 2 and 3, the inlets can be produced as distinct holes in a nozzle as in FIG. 8. In that figure the inlets are manifested as holes 82 in one surface of a hollow nozzle 81. The gases in the first group of reactants is supplied to the nozzle by an inlet 83 for dispersal through holes 82 into the vicinity of the wafers. As in the case of separate inlets, the number and arrangement of the inlets can be selected to minimize the variation in coating thickness produced on a batch of wafers. Such nozzles have the advantage of providing a large number of inlets without a complicated structure but have the limitation that flow through each inlet can't be individually varied to adjust for changing conditions. Such nozzles can also be provided on the sides, above and below the wafers as was discussed above for the case of distinct inlets. Note that it is advantageous to introduce the reactants other than the first group of reactants at a point upstream and away from the region containing the wafers because this enables these reactants to arrive at the surface of the region containing the wafers (where reaction begins) in a more uniform distribution than if supplied closer to the wafers. This produces a more uniform distribution in the region containing the wafers helping to reduce any variation in thickness due to this variation in concentration.

Figure 9:
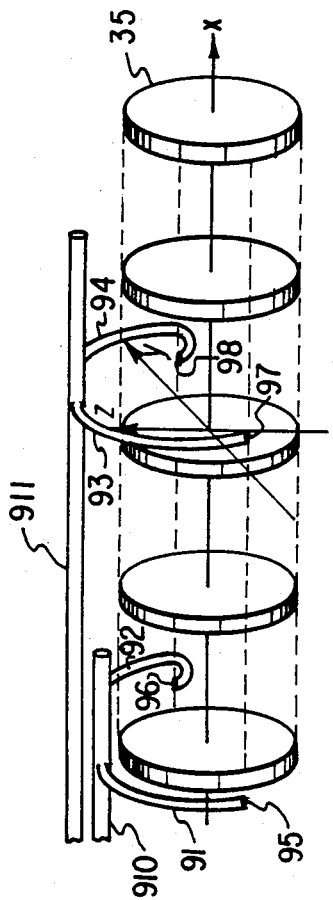
FIG. 9 shows the preferred embodiment of the configuration of the inlets.

To achieve less than a 10% variation in thickness within a batch of wafers coated in a furnace like that in FIG. 3, an arrangement of inlets as shown in FIG. 9 was utilized. A batch of 75 wafers were aligned in a boat to form a cylindrical region containing the wafers having a length $2(1_x)$ of 56 cm and a radius R of 5 cm. The pressure was in the range 0.1–0.5 torr. and the temperature was in the range 400 degrees C. —475 degrees C. The low pressure reduces the rate of reaction (as can be seen by the rate equations discussed above) so that reactants can flow by convection and diffusion to produce a more uniform coating than at higher reaction rates. The $WF_6$ was supplied at 200–500 cc/min. and H2 was supplied through the inlets at 300–500 cc/min. The H₂ was supplied through tubes 910 and 911 having ¼ inch diameter. Tube 910 was terminated at its end and had ⅛ inch diameter tubes 91 and 92 providing inlets for the H₂ gas. Similarly ⅛ inch tubes 93 and 94 were connected to tube 911 to supply H₂ 2 gas. Each tube supplied gas into the chamber through a 0.014 inch diameter opening (i.e., inlets 95–98). Tubes 91–94 were curved to remain outside the volume containing the wafers to enable the wafers to be inserted without moving the inlets.

A circular cylindrical liner of 14 cm diameter encircles the sides of the volume containing the chips and the inlets are oriented to direct the reactant gases away from the x axis so that the gases impinge on the liner. This improves contact of the gases with the hot liner thereby improving the heating of the gases. This improvement in heating is especially important at the low pressures found useful in the tungsten deposition reaction because low pressures reduce heat conductivity thereby reducing the transfer rate of heat to the reactant gases. Since at such low pressures, the liner is heated primarily by infrared radiation from the heating coils, the liner should be formed of a material which absorbs infrared radiation and in addition is thermally conductive in order to adequately heat the impinging reactant gases. Suitable materials include molybdenum, stainless steel and silicon carbide. The use of a liner has several advantages. Conventional CVD reactor systems can be employed without the need to modify or construct a system to line walls which are thermally conductive and UV opaque. Also, the liner can be easily removed from the chamber by sliding it out the door of the chamber—this allows the liner to be removed from the chamber in order to remove reaction products which have deposited on the liner. If such deposited products are not periodically removed, heat transfer into the chamber is reduced and deposited products can flake off of the walls and deposit on the wafers thereby producing defects. If a liner is not utilized then the chamber must be periodically dismantled to enable these deposited products to be removed from the chamber walls.

Inlets 95–98 are located approximately in the plane Z=0. Inlets 95 and 97 direct gases in a minus y and minus z direction whereas inlets 96 and 98 direct gases in a positive y and positive z direction. This arrangement results in the inlets having a common circumferential direction so that the gases from the inlets not only impinge on the liner, they also receive a rotational motion around the axis of the liner. The total motion of the gases (including the flow along the x-axis toward the exhaust port) is therefore a generally spiralling motion which enables the reactants to diffuse into the gaps between adjacent wafers from the entire surface of the region containing the wafers.

Each of the inlets is located approximately 6 cm from the x-axis (i.e. 1 cm from the side of the cylindrical region containing the wafers). Optimum uniformity is achieved with inlets 95–98 placed approximately at the x-positions x='22 cm, −18 cm, 0 cm and 4 cm respectively.

When tungsten is deposited on a wafer by the CVD process described above, it is observed that the tungsten deposits on the wafer on regions of doped silicon (such as in vias) but does not deposit substantially on regions of silicon dioxide. Closer inspection of the wafer shows that some deposition of tungsten occurs over oxide regions at points of the oxide which serve as nucleation centers. For example, at sharp edges in the oxide regions it is observed that some deposition of tungsten occurs. Therefore, to facilitate the uniform chemical vapor deposition of tungsten onto a wafer surface, it has been found to be necessary to produce nucleation centers on top of the oxide regions. This is achieved by sputtering a thin (250 Angstroms) of tungsten onto the wafer before placing the wafer into a CVD furnace for deposition of a thick (20,000 Angstrom) layer of tungsten. In a typical process, a thin (300 Angstrom) layer of nickel is first sputtered onto the wafer to serve as an etch stop for plasma etching of the tungsten layer. The thin tungsten layer is then sputtered on top of the nickel and finally the thick layer of tugsten is applied by chemical vapor deposition. This process has two additional advantages: (1) the nickel layer prevents attack of the oxide regions by the overlaying tungsten layer and (2) the sputtered tungsten layer avoids the oxidation of the nickel when the wafer is transferred from the sputtering chamber to the CVD chamber—this is important because nickel oxide is difficult to etch.

We claim:

1. An improved method of coating integrated circuit wafers by a chemical vapor deposition process of the type in which reactant gases are supplied into a reaction chamber that is enclosed by a chamber wall having a cylindrical side wall and a a pair end walls, said improvement comprising the step of:

encircling the volume containing the wafers with a cylindrical liner which is adjacent to the edges of the wafers, whereby the amount of reactant prdoucts depositing on the side wall of the reaction chamber is reduced and whereby deposits on the side wall which flake off of the side wall are prevented from falling onto the wafers;

at least one of the reactant gases is supplied into the reaction chamber as a plurality of jets of gas that are directed against the inside of the liner before the jets pass into the vicinity of the wafers, thereby producing a turbulence which mixes said at least one of the reactant gases with the other reactants before dispersing them into the vicinity of the wafers;

said jets having the same circumferential direction about the axis of the cylindrical liner so that the reactant gases receive a net rotational motion around the edges of the wafers.

2. An improved method of coating integrated circuit wafers by a chemical vapor deposition process of the type in which reactant gases are supplied into a reaction chamber that is enclosed by a cylindrical chamber wall having closed ends, said method comprising the steps of:

opening one end of the reaction chamber;

inserting a boat containing wafers through this open end of the reaction chamber and through an open end of a cylindrical liner contained within the cylindrical reaction chamber;

supplying at least one reactant gas into the chamber as a jet of gas that is directed against an inside surface of the cylindrical liner that is adjacent to the wafers so that said at least one reactant gas is incident on said inside surface of the liner beore dispersing into the vicinity of the wafers.

3. A method as in claim 2 wherein the liner is formed of a material selected from the group consisting of molybdenum, stainless steel and silicon carbide.

* * * * *